US011434568B2

(12) United States Patent
Rocha-Alvarez et al.

(10) Patent No.: US 11,434,568 B2
(45) Date of Patent: Sep. 6, 2022

(54) HEATED CERAMIC FACEPLATE

(71) Applicant: Applied Materials, Inc., Santa Clara, CA (US)

(72) Inventors: Juan Carlos Rocha-Alvarez, San Carlos, CA (US); David H. Quach, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/040,335

(22) PCT Filed: Mar. 19, 2019

(86) PCT No.: PCT/US2019/022958
§ 371 (c)(1),
(2) Date: Sep. 22, 2020

(87) PCT Pub. No.: WO2019/203975
PCT Pub. Date: Oct. 24, 2019

(65) Prior Publication Data
US 2021/0363635 A1      Nov. 25, 2021

Related U.S. Application Data

(60) Provisional application No. 62/658,726, filed on Apr. 17, 2018.

(51) Int. Cl.
*H01J 37/32*      (2006.01)
*C23C 16/455*      (2006.01)
(Continued)

(52) U.S. Cl.
CPC .... *C23C 16/4557* (2013.01); *C23C 16/45565* (2013.01); *C23C 16/50* (2013.01);
(Continued)

(58) Field of Classification Search
CPC .......... C23C 16/4557; C23C 16/45565; C23C 16/50; C23C 16/46; C23C 16/509;
(Continued)

(56) References Cited

U.S. PATENT DOCUMENTS 5,766,364 A * 6/1998 Ishida ................. C23C 16/5096
118/724
5,935,337 A * 8/1999 Takeuchi .......... C23C 16/45565
118/724
(Continued)

OTHER PUBLICATIONS

International Search Report and Written Opinion dated Jul. 2, 2019 for Application No. PCT/US2019/022958.
(Continued)

*Primary Examiner* — Rudy Zervigon
(74) *Attorney, Agent, or Firm* — Patterson + Sheridan, LLP

(57) ABSTRACT

An apparatus for distributing a gas within a process chamber is disclosed. The apparatus has a body formed from a distribution portion surrounded by a coupling portion. A heater is disposed within the distribution portion to heat the body to an elevated temperature. A bridge extends between the coupling portion and the distribution portion. The bridge limits heat transfer between the distribution portion and the coupling portion.

20 Claims, 5 Drawing Sheets

(51) Int. Cl.
*C23C 16/50* (2006.01)
*C23C 16/509* (2006.01)

(52) U.S. Cl.
CPC ...... *C23C 16/509* (2013.01); *H01J 37/32009* (2013.01); *H01J 37/3244* (2013.01); *H01J 37/32532* (2013.01); *H01J 2237/3321* (2013.01)

(58) Field of Classification Search
CPC .......... H01J 37/3244; H01J 2237/3321; H01J 37/32009; H01J 37/32532; H01L 21/67103; H01L 21/6719
USPC ............ 118/715, 723 E; 156/345.33, 345.34, 156/345.43, 345.44, 345.45
See application file for complete search history.

(56) References Cited

U.S. PATENT DOCUMENTS

| | | | | |
|---|---|---|---|---|
| 5,950,925 | A * | 9/1999 | Fukunaga | C23C 16/45574 239/428 |
| 6,387,182 | B1 * | 5/2002 | Horie | C23C 16/45563 427/349 |
| 6,435,428 | B2 * | 8/2002 | Kim | C23C 16/45574 239/553 |
| 6,453,992 | B1 * | 9/2002 | Kim | C23C 16/45565 118/724 |
| 6,818,096 | B2 * | 11/2004 | Barnes | H01J 37/32009 156/345.43 |
| 6,905,079 | B2 * | 6/2005 | Kuwada | C23C 16/45565 239/128 |
| 7,645,341 | B2 * | 1/2010 | Kennedy | H01J 37/32522 156/345.43 |
| 7,661,386 | B2 * | 2/2010 | Kasai | C23C 16/45572 118/723 R |
| 7,712,434 | B2 * | 5/2010 | Dhindsa | H01J 37/32724 156/345.43 |
| 7,743,730 | B2 * | 6/2010 | Kholodenko | H01J 37/32651 156/345.47 |
| 8,764,902 | B2 * | 7/2014 | Suzuki | C23C 16/45574 156/345.34 |
| 9,045,828 | B2 * | 6/2015 | Turlot | C23C 16/45561 |
| 9,057,128 | B2 * | 6/2015 | Olgado | C23C 16/45572 |
| 9,328,419 | B2 * | 5/2016 | Cheng | C23C 16/45574 |
| 9,816,187 | B2 * | 11/2017 | Rajagopalan | C23C 16/46 |
| 10,023,959 | B2 * | 7/2018 | Sung | C23C 16/45574 |
| 10,062,585 | B2 * | 8/2018 | Lubomirsky | H01J 37/32715 |
| 10,519,545 | B2 * | 12/2019 | Lin | H01J 37/32366 |
| 10,550,473 | B2 * | 2/2020 | Yamada | C23C 16/52 |
| 10,780,447 | B2 * | 9/2020 | Fovell | H01J 37/32449 |
| 10,872,747 | B2 * | 12/2020 | Linebarger, Jr. | H01J 37/32449 |
| 10,954,595 | B2 * | 3/2021 | Noorbakhsh | C23C 16/50 |
| 11,043,360 | B2 * | 6/2021 | Carducci | H01J 37/32009 |
| 11,242,600 | B2 * | 2/2022 | Bansal | C23C 16/4557 |
| 2001/0042799 | A1 * | 11/2001 | Kim | C23C 16/45574 239/128 |
| 2003/0070761 | A1 * | 4/2003 | Turlot | C23C 16/509 156/345.47 |
| 2003/0205202 | A1 * | 11/2003 | Funaki | C23C 16/45565 118/723 E |
| 2005/0000423 | A1 * | 1/2005 | Kasai | C23C 16/45565 257/E21.17 |
| 2005/0221552 | A1 * | 10/2005 | Kao | H01J 37/32357 438/200 |
| 2008/0093341 | A1 * | 4/2008 | Turlot | C23C 16/509 118/723 R |
| 2009/0151639 | A1 * | 6/2009 | Kasai | C23C 16/45519 118/724 |
| 2009/0223932 | A1 * | 9/2009 | Hida | H01J 37/3244 156/345.37 |
| 2010/0065214 | A1 | 3/2010 | Kennedy et al. | |
| 2010/0151687 | A1 | 6/2010 | Dhindsa et al. | |
| 2011/0180233 | A1 * | 7/2011 | Bera | F28F 7/02 165/47 |
| 2012/0222616 | A1 | 9/2012 | Han et al. | |
| 2012/0234945 | A1 * | 9/2012 | Olgado | C23C 16/45572 239/589 |
| 2012/0273135 | A1 * | 11/2012 | Hida | H01J 37/32724 313/42 |
| 2013/0040414 | A1 * | 2/2013 | Niira | C23C 16/509 438/57 |
| 2013/0180963 | A1 * | 7/2013 | Zhang | H01L 21/67069 219/121.54 |
| 2014/0027060 | A1 * | 1/2014 | Ranish | C23C 16/45574 156/345.33 |
| 2014/0076234 | A1 * | 3/2014 | Kao | H01L 21/67109 118/719 |
| 2014/0227881 | A1 * | 8/2014 | Lubomirsky | C23C 16/54 156/345.35 |
| 2015/0226540 | A1 * | 8/2015 | Rajagopalan | C23C 16/50 356/402 |
| 2016/0017497 | A1 * | 1/2016 | Rajagopalan | H01L 21/00 118/712 |
| 2016/0348244 | A1 | 12/2016 | Sabri et al. | |
| 2017/0069470 | A1 * | 3/2017 | Murakami | H01J 37/32091 |
| 2017/0211185 | A1 | 7/2017 | Du Bois et al. | |
| 2017/0365443 | A1 * | 12/2017 | Carducci | H01J 37/3244 |
| 2018/0096865 | A1 * | 4/2018 | Lubomirsky | H01L 21/67069 |
| 2019/0226088 | A1 * | 7/2019 | Zhang | C23C 16/4557 |
| 2020/0399756 | A1 * | 12/2020 | Rajagopalan | H01L 21/687 |
| 2022/0010431 | A1 * | 1/2022 | Daito | C23C 16/45565 |

OTHER PUBLICATIONS

Korean Office Action for Application 10-2019-0044312, dated Dec. 8, 2020.

* cited by examiner

HEATED CERAMIC FACEPLATE

BACKGROUND

Field

The present disclosure generally relates to apparatus for distributing a gas in a process chamber, and more specifically, to a heated ceramic faceplate.

Description of the Related Art

In the fabrication of integrated circuits, deposition processes such as chemical vapor deposition (CVD) or atomic layer deposition (ALD) are used to deposit films of various materials upon semiconductor substrates. In other operations, a layer altering process, such as etching, is used to expose a portion of a layer for further depositions. Often, these processes are used in a repetitive fashion to fabricate various layers of an electronic device, such as a semiconductor device.

As the need for improved devices continues to grow, so too does the need for methods used in manufacturing such devices. The chemistry used in new processes, such as precursor gases, is continually requiring increased process control, such as temperature control, to carry out such processes. Accordingly, there is a need in the art for process chamber components that can provide increased temperature control for device manufacturing and processing.

SUMMARY

In one embodiment, a faceplate has a body formed from a heater layer and an electrode layer. An outer diameter of the electrode layer defines a distribution portion of the body. A plurality of apertures is formed through the body within the distribution portion for passage of a gas therethrough. A heater is disposed within the heater layer to heat the body. A bridge surrounds the distribution portion and couples the distribution portion to a coupling portion.

In another embodiment, a faceplate has a body wherein the body is formed from an electrode layer, a heater layer, and a grounding layer. A bonding layer is disposed between the electrode layer and the heater and between the heater layer and the grounding layer. A plurality of apertures is formed through the body. Each aperture has a first end and a second end, wherein the first end is located at an outer surface of the body and the second end of each aperture is fluidly coupled to one or more nozzles disposed in the electrode layer. The body also includes a thermal choke.

In another embodiment, a gas distribution apparatus has a ceramic body. The body is formed from a first layer, a second layer, and a third layer. A plurality of apertures is formed through the ceramic body. A heater is disposed in the first layer and an electrode disposed in the second layer. A bridge portion extends perpendicularly from the third layer. A coupling portion is disposed at an end of the bridge portion opposite the third layer. The bridge portion is a thermal choke which limits heat transfer from the heater to the coupling portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to an apparatus for gas distribution in a process chamber. More specifically, aspects of the disclosure relate to a ceramic faceplate. The faceplate has a ceramic body formed from a distribution portion surrounded by a coupling portion. A heater is disposed within the distribution portion to heat the body to an elevated temperature. A bridge extends between the coupling portion and the distribution portion. The bridge limits heat transfer between the distribution portion and the coupling portion.

Figure 1:
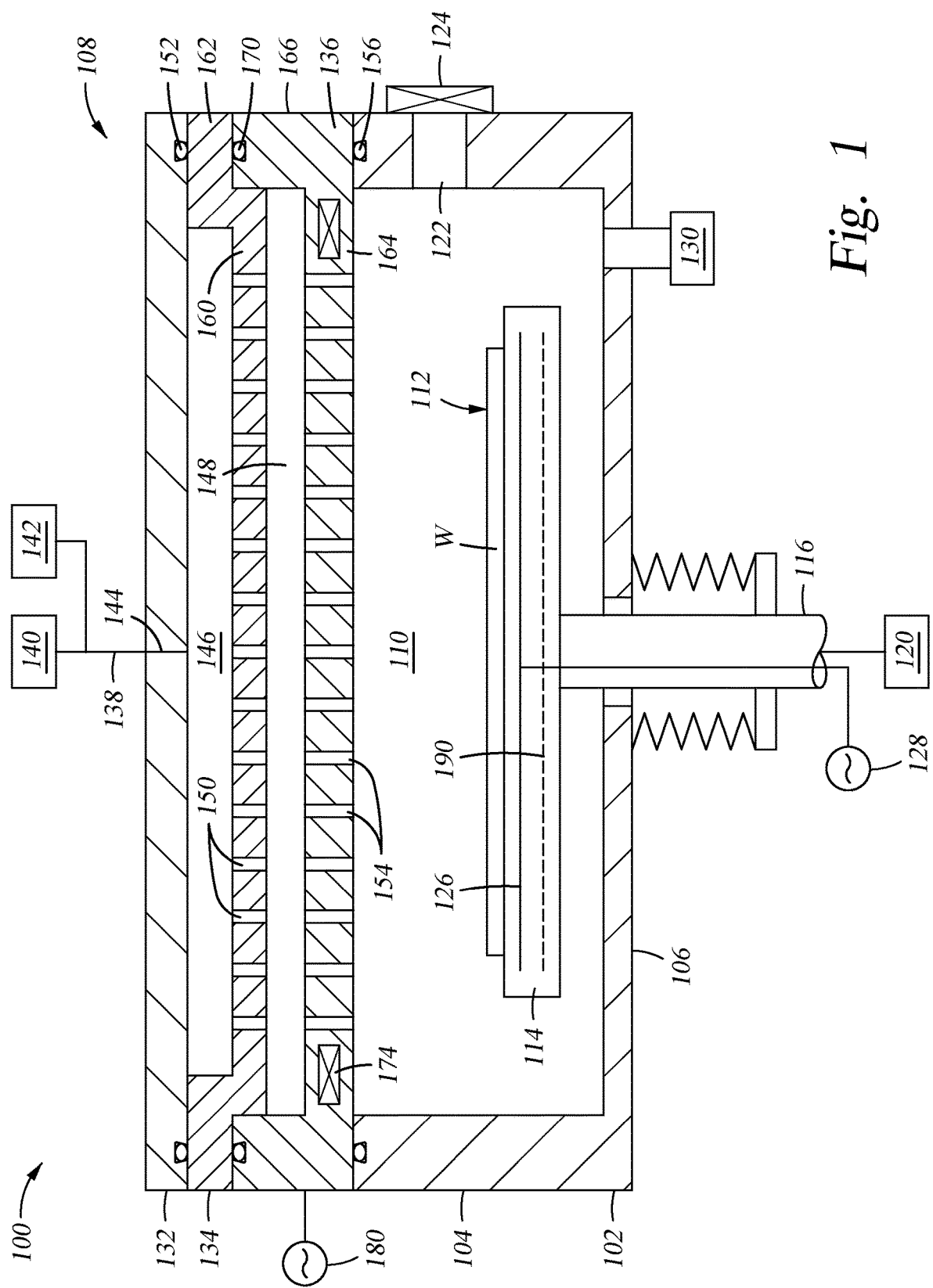
FIG. 1 illustrates a schematic arrangement of an exemplary process chamber according to one embodiment of the present disclosure.

FIG. 1 illustrates a schematic cross-sectional view of an exemplary process chamber 100 according to one embodiment. The process chamber 100 has a body 102 having a sidewall 104 and a base 106. A lid assembly 108 couples to the body 102 to define a process volume 110 therein. The body 102 is formed from a metal, such as aluminum or stainless steel, but any material suitable for use with process therein may be utilized. A substrate support 112 is disposed within the process volume 110 and supports a substrate W during processing within the process chamber 100. The substrate support 112 includes a support body 114 coupled to a shaft 116. The shaft 116 is coupled to a lower surface of the support body 114 and extends out of the body 102 through an opening 118 in the base 106. The shaft 116 is coupled to an actuator 120 to vertically move the shaft 116 and the support body 114 coupled thereto, between a substrate loading position and a processing position. A vacuum system 130 is fluidly coupled to the process volume 110 in order to evacuate gases from the process volume 110.

To facilitate processing of a substrate W in the process chamber 100, the substrate W is disposed on an upper surface of the support body 114 opposite of the shaft 116. A port 122 is formed in the sidewall 104 to facilitate ingress and egress of the substrate W into the process volume 110. A door 124, such as a slit valve, is actuated to selectively enable the substrate W to pass through the port 122 to be loaded onto, or removed from, the substrate support 112. An electrode 126 is disposed within the support body 114 and electrically coupled to a power source 128 through the shaft 116. The electrode 126 is selectively biased by the power source 128 to create an electromagnetic field to chuck the substrate W to the upper surface of the support body 114 and/or to facilitate plasma generation or control. In certain embodiments, a heater 190, such as a resistive heater, is disposed within the support body 114 to heat the substrate W disposed thereon.

The lid assembly 108 includes a lid 132, a blocker plate 134, and a faceplate 136. The blocker plate 134 includes a recessed circular distribution portion 160 surrounded by an annular extension 162. The blocker plate 134 is disposed between the lid 132 and the faceplate 136 and is coupled to each of the lid 132 and the faceplate 136 at the annular extension 162. The lid 132 couples to an upper surface of the annular extension 162 opposite the body 102. The faceplate 136 couples to a lower surface of the annular extension 162. A first volume 146 is defined between the blocker plate 134 and the lid 132. A second volume 148 is defined between the blocker plate 134 and the faceplate 136. A plurality of apertures 150 are formed through the distribution portion 160 of the blocker plate 134 and facilitate fluid communication between the first volume 146 and the second volume 148.

An inlet port 144 is disposed within the lid 132. The inlet port 144 is fluidly coupled to a gas conduit 138. The gas conduit 138 enables a gas to flow from a first gas source 140, such as a process gas source, through the inlet port 144 into the first volume 146. A second gas source 142, such as a cleaning gas source, is optionally coupled to the gas conduit 138.

In one example, the first gas source 140 supplies a first gas, such as an etching gas or a deposition gas, to the process volume 110 to etch or deposit a layer on the substrate W. The second gas source 142 supplies a second gas, such as a cleaning gas, to the process volume 110 in order to remove particle depositions from internal surfaces of the process chamber 100, such as surfaces of the sidewall 104 facing the process volume 110. A seal 152, such as an O-ring, is disposed between the blocker plate 134 and the lid 132 at the upper surface of the annular extension 162 surrounding the first volume 146 in order to isolate the process volume 110 from the external environment, enabling maintenance of a vacuum therein by the vacuum system 130.

The faceplate 136 has a distribution portion 164 and a coupling portion 166 disposed radially outward of the distribution portion 164. The distribution portion 164 is disposed between the process volume 110 and the second volume 148. The coupling portion 166 surrounds the distribution portion 164 at a periphery of the faceplate 136. To facilitate processing of a substrate W, an RF generator 180 is optionally coupled to the faceplate 136 to excite a gas from the first gas source 140, the second gas source 142, or both the first gas source 140 and the second gas source 142 to form an ionized species. In one example, the RF generator 180 and the faceplate 136, in conjunction with the electrode 126 and the power source 128, facilitate generation of a capacitively coupled plasma within the process volume 110.

One or more apertures 154 are disposed through the faceplate 136 within the distribution portion 164. The apertures 154 enable fluid communication between the process volume 110 and the second volume 148. During operation, a gas flows from the inlet port 144 into the first volume 146, through apertures 150 in the blocker plate 134, and into the second volume 148. From the second volume 148, the gas flows through the apertures 154 in the faceplate 136 into the process volume 110. The arrangement and sizing of the apertures 154 enables the selective flow of the gas into the process volume 110 to achieve a desired gas distribution. For example, a uniform distribution across the substrate may be desired for certain processes.

One or more heaters 174 are disposed in the faceplate 136. In one embodiment, the heaters 174 are disposed radially outward of the apertures 154. The heaters 174 may be any device capable of providing heat to the faceplate 136. In one example, the heaters 174 include a resistive heater, which may be embedded within and encircling the apertures 154 of the faceplate 136. In another example, the heaters 174 are a channel in fluid communication with a fluid source (not shown) formed in the faceplate 136 that circulates a heated fluid therethrough. The heaters 174 heat the faceplate to a high temperature, such as 300° C. and higher. For example, the heaters 174 may heat the faceplate to 400° C., 500° C., or higher. Increasing the temperature of the faceplate during processing to a temperature such as 300° C., 400° C., or 500° C. during processing, such as during a chemical vapor deposition (CVD) process, results in improved deposition on, and processing of, the substrate W.

A seal 170 is disposed between the faceplate 136 and the blocker plate 134 to enable maintenance of a vacuum within the process volume 110. A second seal 156 is disposed between the faceplate 136 and the sidewall 104. In the embodiment of FIG. 1, both seals 156, 170 are O-rings formed from materials such as polytetrafluoroethylene (PTFE), rubber, or silicone. Other seal designs, such as sheet gaskets or bonds, are also contemplated. O-rings may be quickly repaired or replaced, for example, during a scheduled preventative maintenance of the process chamber, thus greatly reducing the maintenance downtime of the process chamber.

Figure 2:
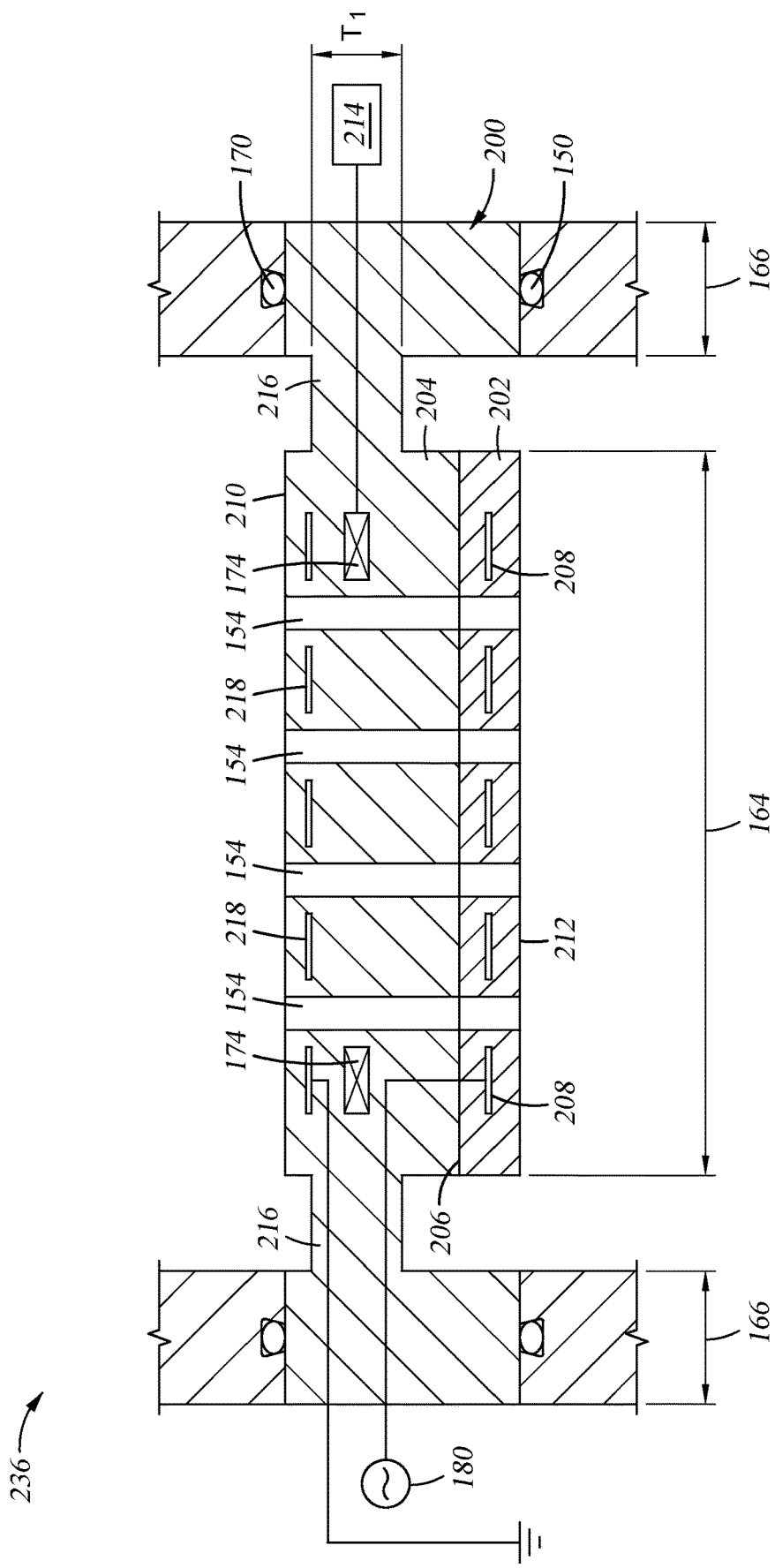
FIG. 2 illustrates a schematic arrangement, in cross-section, of an exemplary faceplate according to one embodiment of the present disclosure.

FIG. 2 illustrates a schematic cross-section arrangement of a faceplate 236 according to one embodiment. The faceplate 236 may be used in place of faceplate 136 shown in FIG. 1. Here, the faceplate 236 has a body 200 formed from an electrode layer 202 and a heater layer 204 coupled together by a bonding layer 206. In the embodiment, the electrode layer 202 and the heater layer 204 are separate members coupled together to form the body 200. However, a single, unitary member may also be used to form the body 200. The bonding layer 206 is a thermally conductive layer disposed between heater layer 204 and the electrode layer 202. In one example, the bonding layer 206 is a diffusion bond. The bonding layer 206 may be any suitable bond type which adequately conducts heat between the electrode layer 202 and the heater layer 204 while providing sufficient adhesion therebetween.

The distribution portion 164 is partially defined by a top surface 210 and a bottom surface 212. An outer diameter of the distribution portion 164 is defined by an outer diameter of the electrode layer 202. The apertures 154 are formed through the body 200 in the distribution portion 164. The apertures 154 are formed through both the electrode layer 202 and the heater layer 204 between the top surface 210 and the bottom surface 212. Here, the apertures 154 are arranged in a honeycomb array such that a center of a first aperture is spaced from the center of an adjacent second aperture at a distance between about 2 mm and about 6 mm, such as about 3 mm and about 5 mm. For example, the apertures 154 are arranged such that a center of a first aperture is spaced from the center of an adjacent second aperture at a distance of 4 mm. In another example, the center-to-center distance of adjacent apertures 154 is about 5 mm to about 6 mm. It is to be noted that other arrangements, such as a lattice or a grid layout, may be utilized herewith.

The electrode layer 202 is formed from a ceramic material, such as aluminum nitride. An electrode 208 is disposed within the electrode layer 202. The electrode 208 is formed within the electrode layer 202 during manufacturing thereof. The electrode 208 is electrically coupled to a power source, such as the RF generator 180 of FIG. 1, in order to provide an electrical current thereto. During operation, the electrode 208 functions to form and/or control a plasma for processing a substrate using the electric current provided from the power source. As shown, portions of the electrode 208 are disposed between the apertures 154. Using conventional methods of manufacturing a faceplate, the short center-to-center distance between adjacent apertures 154 prevents positioning of an electrode therebetween. However, by forming the electrode layer 202 separately from the heater layer 204, the electrode 208 can be positioned between the adjacent apertures 154, thus improving control of the plasma formed using the electrode 208.

The heater layer 204 is also formed from a ceramic material, for example, aluminum nitride. A grounding electrode 218 is optionally disposed in the heater layer 204 in the distribution portion 164. The grounding electrode 218 prevents an electric field created by the electrode 208 in the electrode layer 202 from forming a plasma in a region representatively above the body 200 and adjacent to the top surface 210.

A heater 174 is disposed within the heater layer 204 radially surrounding the apertures 154. The heater 174 is coupled to a heat source 214, such as a power source in the case of electric resistance heater, or a fluid source in the case of a fluid channel. During operation, the heater 174 is activated by the heat source 214 to elevate a temperature of the distribution portion 164 to a high temperature, for example greater than about 300° C., such as 350° C. or higher. The heat provided from the heater 174 is conducted therefrom and dispersed throughout the heater layer 204 and the heater layer 204, in particular, through the material between adjacent apertures 154. Therefore, the uniformity of the heating of the distribution portion 164 is greatly increased. By elevating the temperature of the distribution portion 164, a gas passed through the apertures 154 is heated by the body 200.

In the embodiment of FIG. 2, the coupling portion 166 is disposed radially surrounding the distribution portion 164. Here, the distribution portion 164 defines a disc-like body. The coupling portion 166 is an annular flange disposed around the distribution portion 164. A bridge 216 extends between and joins the distribution portion 164 and the coupling portion 166. The bridge 216 has a reduced thickness $T_1$ relative to the thickness of the coupling portion 166 and/or the distribution portion 164. By limiting the surface area and/or mass for heat transfer, the bridge 216 functions as a thermal choke to prevent heat transfer between the distribution portion 164 and the coupling portion 166. In one example, the coupling portion 166 is maintained at a temperature of less than 300° C., such as less than about 280° C., for example, about 250° C.

In another example, the bridge 216 has the thickness equal to the coupling portion 166 and/or the distribution portion 164. In this arrangement, other types of thermal chokes, such as interleaved channels, fluid circulation channels, or the like, can be used to prevent heat transfer from the distribution portion 164 to the coupling portion 166.

Figure 3:
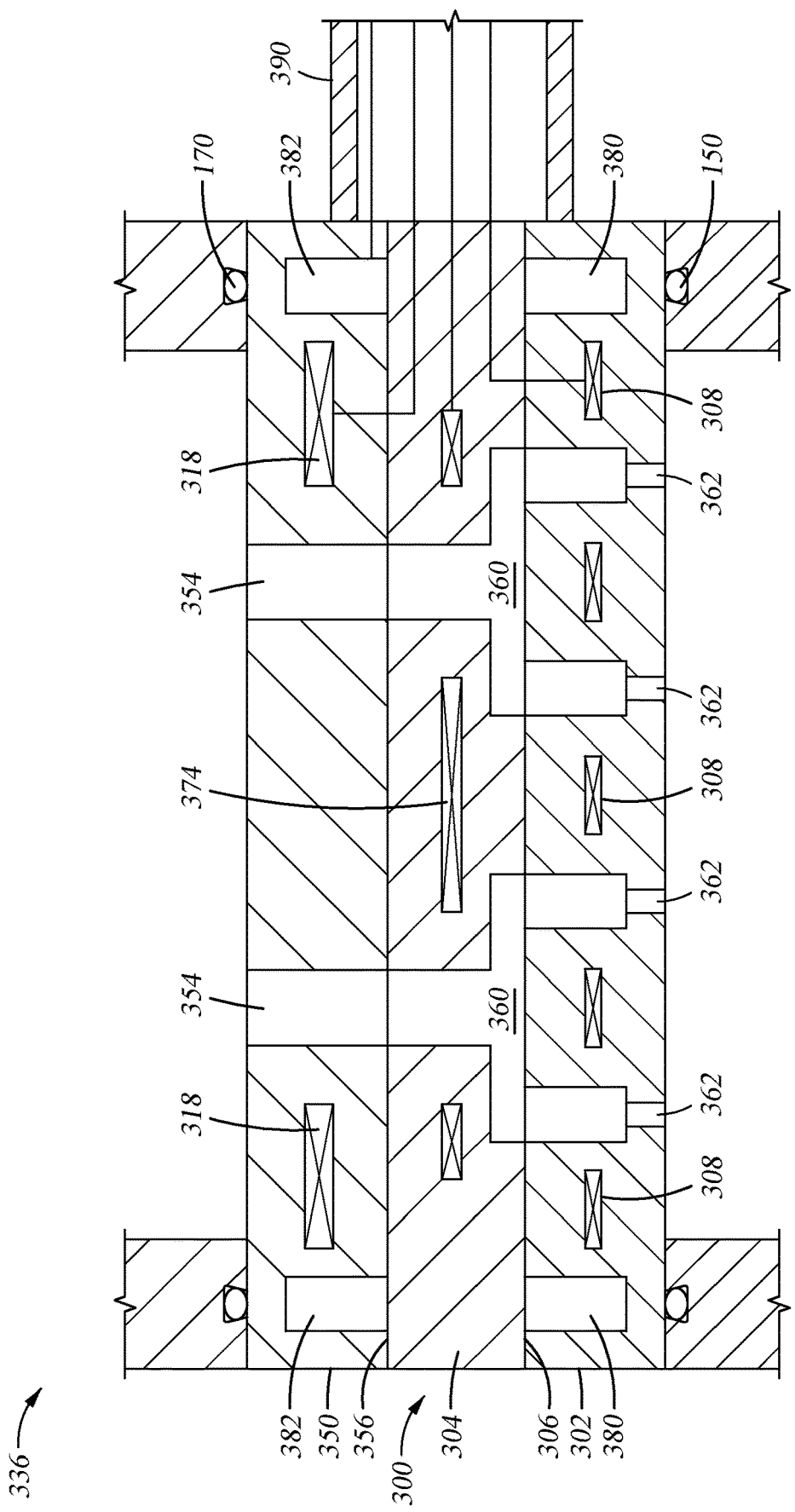
FIG. 3 illustrates a schematic arrangement, in cross-section, of an exemplary faceplate according to another embodiment of the present disclosure.

FIG. 3 illustrates a faceplate 336 according to another embodiment. The faceplate 336 uses a three layer construction to form a body 300. An electrode layer 302 is coupled to a first surface of a heater layer 304 by a first bonding layer 306. A grounding layer 350 is coupled to a second surface of the heater layer 304 by a second bonding layer 356. Thus, the heater layer 304 is disposed between the grounding layer 350 and the electrode layer 302. The electrode layer 302, the heater layer 304, and the grounding layer 350 are generally formed from a ceramic material, such as aluminum nitride, but other materials are also contemplated. A grounding electrode 318 is disposed within the grounding layer 350. Similarly, an electrode 308 is disposed in the electrode layer 302. The function of the grounding electrode 318 and the electrode 308 is similar to that of the respective grounding electrode 218 and the electrode 208 of FIG. 2. A heater 374 is also disposed in the heater layer 304 to heat the body 300. The function of the heater 374 is similar to that of heater 274 of FIG. 2. In one example, the heater 374, the electrode 308, and the grounding electrode 318 are coupled to power sources (not shown) outside of the process chamber through a facility conduit 390.

In the embodiment of FIG. 3, one or more apertures 354 are formed in the grounding layer 350 and the heater layer 304. The apertures 354 extend from an outer surface of the body 300, representatively the top surface, through the grounding layer 350, and open into a distribution volume 360. The distribution volume 360 is formed in heater layer 304 in order to urge a gas flowed through the apertures 354 to distribute therethrough and increase residence time of the gas to interact with the heated body 300. In one example, the distribution volume 360 facilitates increased residence time by creating a non-linear flow path within the body 300. In one example, the non-linear flow path includes a plurality of perpendicular flow paths. A plurality of nozzles 362 are formed in the electrode layer 302 and are in fluid communication with the distribution volume 360. In one example, the nozzles 362 have a cross-sectional area that is about half the area of the cross-section of apertures 354. Therefore, the nozzles 362 restrict the flow of the gas through the distribution volume 360 to further increase residence time of the gas therein. The apertures 354 are arranged in a honeycomb array such that a center of a first aperture is spaced from the center of an adjacent second aperture at a distance between about 4 mm and about 6 mm. The center-to-center distance between adjacent nozzles 362 is about 3 mm. Here, only two apertures 354, distribution volumes 360, and mating nozzles 362 coupled to each distribution volume 360, are shown. However, other numbers and arrangements may be utilized herewith.

Thermal chokes 380 are disposed within the electrode layer 302. Similarly, thermal chokes 382 are disposed in the grounding layer 350. The thermal chokes 380, 382 are disposed radially outward of the apertures 354. The thermal chokes 380, 382 limit heat transfer from the heaters 374 towards seals 156, 170. The thermal chokes 380, 382 are, for example, channels for circulating a fluid, such as a gas or a liquid, for limiting heat transfer therethrough. The thermal chokes 380, 382 are optionally coupled to a cooling system (not shown) such as a heat exchanger through the facility conduit 390 for cooling the circulated fluid. In another example, the thermal chokes 380, 382 are air gaps or a series of interleaved veins which minimize the cross-section of the respective electrode layer 302 and the grounding layer 350 for thermal conduction of heat adjacent the thermal chokes 380, 382.

Figure 4:
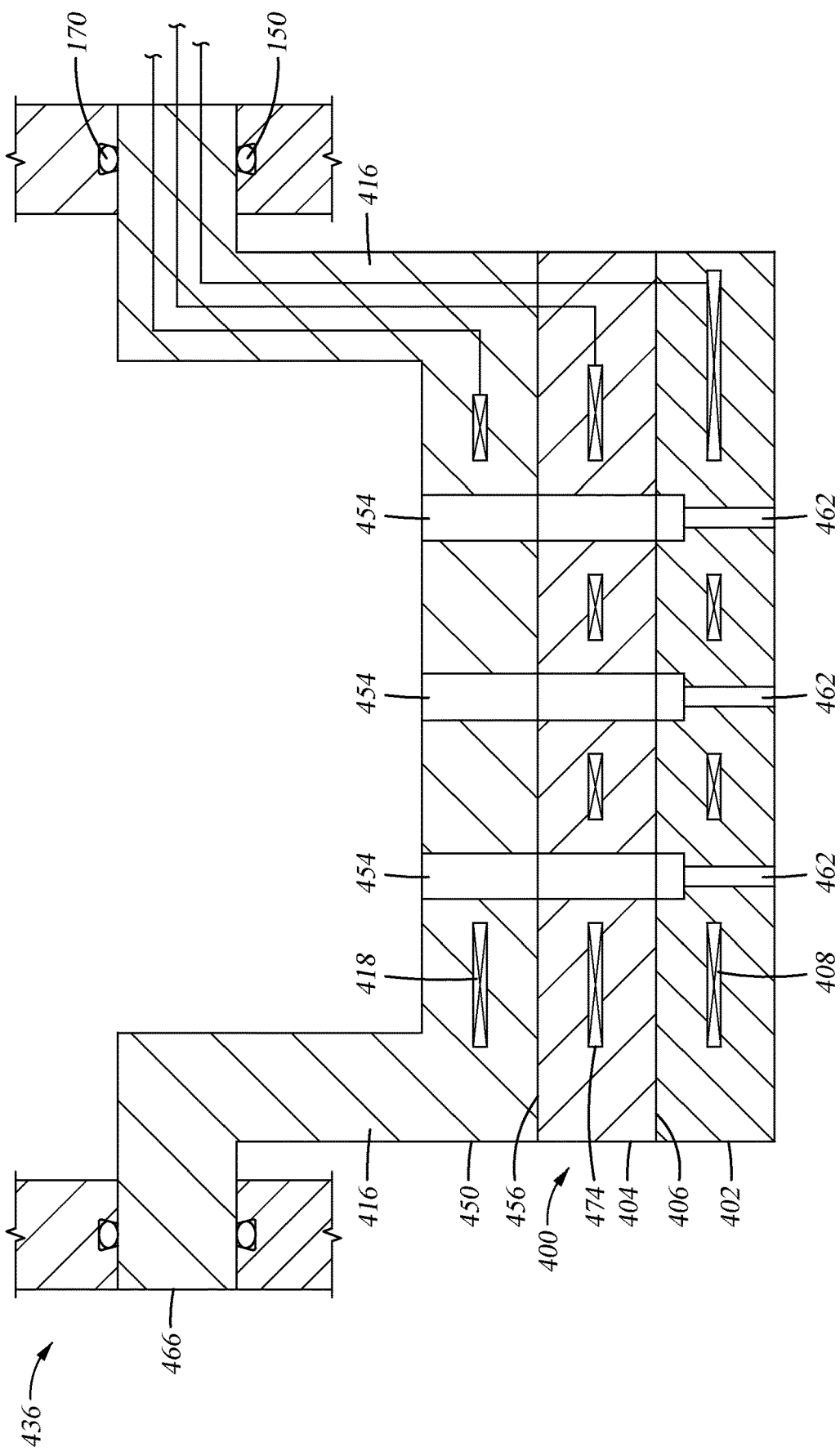
FIG. 4 illustrates a schematic arrangement, in cross-section, of an exemplary faceplate according to another embodiment of the present disclosure.

FIG. 4 is a faceplate 436 according to another embodiment. The faceplate 436 has a body 400 that uses a three layer construction similar to that of the body 300 of FIG. 3 but includes a bridge 416. The body 400 includes an electrode layer 402, a heater layer 404, and a grounding layer 450 coupled by bonding layers 406, 456. An electrode 408 and a grounding electrode 418 are also disposed within the body 400. The bridge 416 extends representatively upward and suspends the faceplate 436 from the coupling portion 466. The bridge 416 has a reduced thickness, thus forming a thermal choke which limits heat transfer from the heaters 474 towards the coupling portion 466 in contact with seals 156, 170. In the illustrated example, the bridge 416 extends perpendicularly from the coupling portion 466 and the body 400. However, other configurations are also contemplated.

One or more apertures 454 are formed through the grounding layer 450, the heater layer 404, and into the electrode layer 402. At an end thereof, the apertures 454 are coupled to a plurality of nozzles 462 which are similar to the nozzles 362 of FIG. 3. In such an example, the nozzles 462 have a diameter less than a diameter of the apertures 454, such as a diameter about half of the diameter of the apertures 454. Again, a center-to-center distance between adjacent nozzles 462 and respective apertures 454 is about 2 mm to about 6 mm, such as about 5 mm to about 6 mm.

Figure 5:
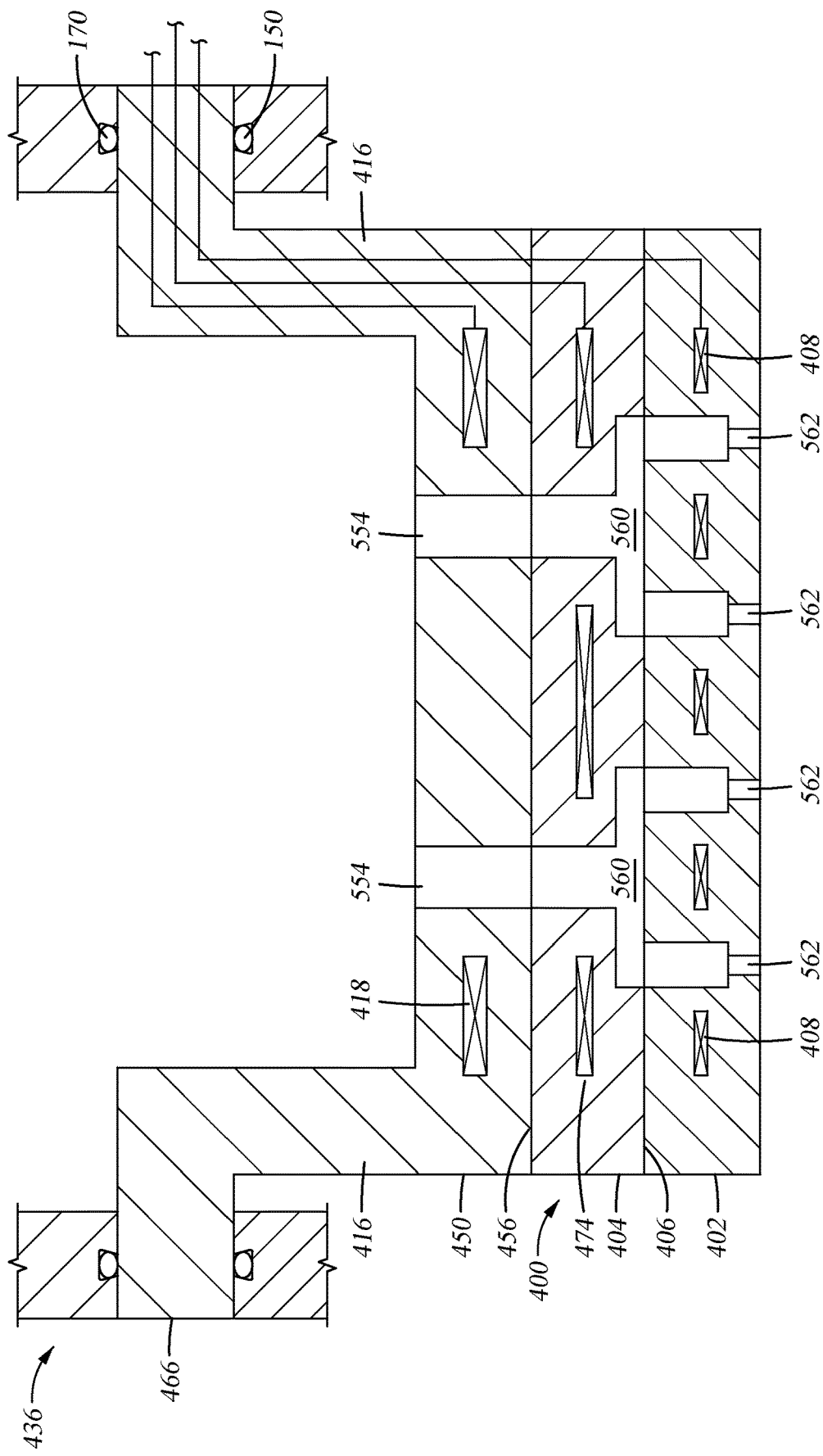
FIG. 5 illustrates a schematic arrangement, in cross-section, of an exemplary faceplate according to another embodiment of the present disclosure.

FIG. 5 is a faceplate 536 according to another embodiment. The faceplate 536 is similar to the faceplate 436 but utilizes a different arrangement of apertures 554. Here, the apertures 554 extend from a surface of the body 400 at a first end and open into a distribution volume 560 at a second end. The distribution volume 560 is formed in a heater layer 504 in order to urge a gas flowed through the apertures 554 to distribute therethrough and increase residence time of the gas to interact with the heated body 400. A plurality of nozzles 562 are formed in the electrode layer 402 and are in fluid communication with the distribution volume 560. In one example, the nozzles 562 have a cross-sectional area that is about half of the cross-sectional area of the apertures 554. Therefore, the nozzles 562 restrict the flow of the gas through the distribution volume 560 to further increase residence time of the gas therein. A center-to-center distance between adjacent apertures 554 is about 6 mm and a center-to-center distance between adjacent nozzles 562 is about 3 mm.

In conventional designs, a faceplate is generally not heated to the high temperatures described herein (e.g., such as about 300° C., 400° C., or 500° C.) because materials used for the construction of such conventional faceplates, such as aluminum, lack sufficient strength at the elevated temperatures. However, a ceramic material, such as aluminum nitride, has desirable strength and thermal expansion at the elevated temperatures described herein. Additionally, sealing materials degrade at elevated temperatures, such as 300° C. or above. However, by utilizing faceplates with a bridge and/or thermal chokes as described herein, conduction of the heat provided by the heaters from an area of the faceplate proximate the distribution portion to the coupling portion having seals, illustratively seals 156, 170, is reduced therein. Accordingly, an inner portion of faceplate proximate to process volume may be heated to elevated temperatures to improve deposition onto a substrate W being processed while an outer portion, adjacent seals 156, 170, is maintained at a lower temperature to protect the seals 156, 170 from thermal degradation.

The embodiments disclosed herein advantageously provide a faceplate capable of being heated to high temperatures, such as above 300° C. The ceramic material provides adequate strength at the elevated temperatures. Meanwhile, the seals coupled to the faceplate are maintained at a temperature which prevents thermal degradation thereof.

While the foregoing is directed to embodiments of the present disclosure, other and further embodiments of the disclosure may be devised without departing from the basic scope thereof, and the scope thereof is determined by the claims that follow.

What is claimed is:

1. A faceplate for processing substrates, comprising:
   a body, wherein the body comprises:
      an electrode layer;
      a heater layer;
      a grounding layer; and
      a bonding layer disposed between the electrode layer and the heater layer and between the heater layer and the grounding layer;
   a plurality of apertures formed through the body having a first end and a second end, wherein the first end is located at an outer surface of the body and the second end of each aperture is fluidly coupled to one or more nozzles disposed in the electrode layer; and
   a thermal choke.

2. The faceplate of claim 1, further comprising a distribution volume disposed between the apertures and the nozzles.

3. The faceplate of claim 1, wherein the thermal choke comprises one or more fluid circulation channels.

4. The faceplate of claim 1, wherein each of the electrode layer, the heater layer, and the grounding layer are formed from a ceramic material.

5. The faceplate of claim 1, wherein a heater is disposed in the heater layer, and wherein the thermal choke limits the heat transfer from the heater to an area proximate a seal disposed radially outward of the heater.

6. The faceplate of claim 1, wherein a cross-sectional area of the apertures is about twice a cross-sectional area of the nozzles.

7. A gas distribution apparatus for processing substrates, comprising:
   a ceramic body, wherein the body is formed from a first layer, a second layer, and a third layer;
   a plurality of apertures formed through the ceramic body;
   a heater disposed in the first layer;
   an electrode disposed in the second layer; and
   a bridge portion extending perpendicularly from the third layer, wherein a coupling portion is disposed at an end of the bridge portion opposite the third layer, wherein the bridge portion is a thermal choke which limits heat transfer from the heater to the coupling portion.

8. The gas distribution apparatus of claim 7, wherein the apertures are arranged in a honeycomb array, wherein a center-to-center distance between adjacent apertures is between about 2 mm and about 6 mm.

9. The faceplate of claim 1, wherein the thermal choke comprises a plurality of interleaved veins disposed through the electrode layer.

10. The faceplate of claim 4, wherein the ceramic material is aluminum nitride.

11. The gas distribution apparatus of claim 7, wherein each of the plurality of apertures is fluidly coupled to one or more nozzles disposed through the electrode layer, and wherein a cross-sectional area of each aperture is about twice a cross-sectional area of each nozzle.

12. The gas distribution apparatus of claim 7, wherein the ceramic body is formed of aluminum nitride.

13. A faceplate for processing substrates, comprising:
   a body, wherein the body comprises:
      a first layer comprising a first electrode;
      a second layer comprising a heater;

a third layer comprising a second electrode; and a bonding layer disposed between the first layer and the second layer and between the second layer and the third layer;

a plurality of apertures formed through the body having a first end and a second end, wherein the first end is located at an outer surface of the third layer and the second end of each aperture is fluidly coupled to one or more nozzles disposed in the first layer; and a bridge extending perpendicularly form the third layer, the bridge comprising a thermal choke.

14. The faceplate of claim 13, wherein one or more of the first layer, the second layer, and the third layer are formed from a ceramic material.

15. The faceplate of claim 14, wherein the ceramic material comprises aluminum nitride.

16. The faceplate of claim 13, wherein a cross-sectional area of the apertures is about twice a cross-sectional area of the nozzles.

17. The faceplate of claim 13, wherein the second electrode comprises a grounding electrode.

18. The faceplate of claim 13, wherein the thermal choke comprises one or more fluid circulating channels.

19. The faceplate of claim 18, wherein the thermal choke limits the heat transfer from the heater to an area proximate a seal disposed radially outward of the heater.

20. The faceplate of claim 13, wherein the heater comprises one or more fluid circulating channels.

\* \* \* \* \*